(12) United States Patent
Zhao

(10) Patent No.: US 11,315,959 B2
(45) Date of Patent: Apr. 26, 2022

(54) ARRAY SUBSTRATE AND DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventor: Xiaofeng Zhao, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 226 days.

(21) Appl. No.: 16/642,304

(22) PCT Filed: Jan. 8, 2020

(86) PCT No.: PCT/CN2020/070804
§ 371 (c)(1),
(2) Date: Feb. 26, 2020

(87) PCT Pub. No.: WO2021/068435
PCT Pub. Date: Apr. 15, 2021

(65) Prior Publication Data
US 2021/0408079 A1    Dec. 30, 2021

(30) Foreign Application Priority Data
Oct. 8, 2019   (CN) .......................... 201910951289.8

(51) Int. Cl.
*H01L 27/12*       (2006.01)

(52) U.S. Cl.
CPC .............................. *H01L 27/1248* (2013.01)

(58) Field of Classification Search
CPC . H01L 27/1248; G02F 1/1362; G02F 1/1335; G02F 1/136286
See application file for complete search history.

(56) References Cited

U.S. PATENT DOCUMENTS

| | | | |
|---|---|---|---|
| 2007/0188689 A1* | 8/2007 | Nakamura | G02F 1/133502 349/122 |
| 2012/0120294 A1* | 5/2012 | Nishikido | H04N 5/378 348/308 |
| 2012/0263872 A1 | 10/2012 | Takada | |
| 2017/0170199 A1* | 6/2017 | Zhang | H01L 51/5284 |
| 2019/0027518 A1* | 1/2019 | Miyata | H01L 27/1462 |

FOREIGN PATENT DOCUMENTS

| | | |
|---|---|---|
| CN | 101017269 A | 8/2007 |
| CN | 101464534 A | 6/2009 |
| CN | 107085337 A | 8/2017 |
| CN | 108983487 A | 12/2018 |
| CN | 110082977 A | 8/2019 |

* cited by examiner

*Primary Examiner* — Karen Kusumakar
*Assistant Examiner* — Adam S Bowen

(57) ABSTRACT

The present disclosure provides an array substrate and a display panel. The array substrate includes a wiring layer, and a non-wiring layer located on a bottom portion of the wiring layer. The non-wiring layer includes a first film layer and a second film layer, which are sequentially stacked in a direction away from the wiring layer. A refractive index of the second film layer is smaller than a refractive index of the first film layer.

7 Claims, 3 Drawing Sheets

ARRAY SUBSTRATE AND DISPLAY PANEL

This application claims priority from a Chinese patent application filed in the Chinese Patent Office on Oct. 8, 2019, with application number 201910951289.8, and is titled as "array substrate and display panel", the entire contents of which are incorporated herein by reference.

FIELD OF THE INVENTION

The present disclosure relates to the technical field of displays, and specifically to an array substrate and a display panel.

BACKGROUND OF THE INVENTION

Electronic devices provided with a high screen occupation ratio are increasingly favored by consumers. The screen occupation ratio refers to a relative ratio of an area of a screen to a front panel of an electronic product, which is a parameter that makes an appearance design of the electronic product easier to obtain a visual favorable impression. The screen occupation ratio of current electronic products is relatively small. In particular, upper and lower bezels occupy a large screen occupation ratio due to handset, camera, and HOME-key, resulting in a case of that utilization of the screen occupation ratio is low under a premise of appearance. Therefore, under a premise that overall dimensions of traditional electronic products are unchanged, how to increase the screen occupation ratio, such as decreasing the upper and lower bezels, in order to give consumers a better visual experience, which has become one of current important research directions.

SUMMARY OF THE INVENTION

In order to realize a higher screen occupation ratio, a camera under a screen is a feasible and effective solution, but how to achieve a coexistence of photography and display is a technical problem. In particular, there are multiple wiring formed a regular arrangement in a display panel. In a display panel provided with high pixels per inch (PPI), a wire width of the wiring is on an order of micrometers, which is very close to a visible light band. Visible light is extremely prone to interference and diffraction after passing through the display panel. There is a great risk of disruption for imaging by a camera which requires high display accuracy. Therefore, how to avoid interference and diffraction of transmitting light, resulting in the disruption to the imaging by the camera, is an important issue that needs to be solved urgently.

In order to solve the above problem, embodiments of the present disclosure provide an array substrate and a display panel, which can effectively solve a problem of interference and diffraction of light.

The embodiments of the present disclosure provide an array substrate and a display panel, which include a wiring layer; and a non-wiring layer located on a bottom portion of the wiring layer; wherein the non-wiring layer includes a first film layer and a second film layer, the first film layer and the second film layer are sequentially stacked in a direction away from the wiring layer, and a refractive index of the second film layer is smaller than a refractive index of the first film layer.

Further, the first film layer is disposed at the bottom portion of the wiring layer, and the second film layer is disposed adjacent to the first film layer and is located on a bottom portion of the first film layer.

Further, the non-wiring layer further includes a third film layer, wherein the third film layer is disposed on a top portion of the non-wiring layer, the first film layer is disposed adjacent to the third film layer and is located on a bottom portion of the third film layer, and the second film layer is disposed adjacent to the first film layer and is located on a bottom portion of the first film layer.

Further, the non-wiring layer further includes a third film layer, wherein the first film layer is disposed on a top portion of the non-wiring layer, the second film layer is disposed adjacent to the first film layer and is located on a bottom portion of the first film layer, and the third film layer is disposed adjacent to the second film layer and is located on a bottom portion of the second film layer.

Further, a through hole is provided at a layer being the lowest within the non-wiring layer, and the through hole is configured to enhance light transmittance of the non-wiring layer.

Further, a region where the through hole locates corresponds to a region where an external camera places.

Further, a material of the second film layer is one of silicon oxide, silicon nitride, or indium tin oxide.

Further, the refractive index of the second film layer ranges from 1.4 to 2.1.

One embodiment of the present disclosure also provides a display panel, which includes the above array substrate.

Advantages of the present disclosure are that, by providing a combined structure (such as the first film layer and the second film layer), the light producing interference and diffraction is emitted from an optically dense medium region (such as the first film layer) to an optically sparse medium region (such as the second film layer), resulting in that the light with a larger incident angle is totally reflected. In addition, even if the light with a smaller incident angle cannot be totally reflected, when the light with the smaller incident angle passes through this combined structure, a refraction angle will be increased. Thus, it can reduce the light producing interference and diffraction to enter a camera, to make the imaging of the camera below the screen free from the light producing interference and diffraction. In addition, by providing the through hole, light transmittance of the display panel is increased to make the camera shoot better.

DETAILED DESCRIPTION OF PREFERRED EMBODIMENTS

Figure 1:
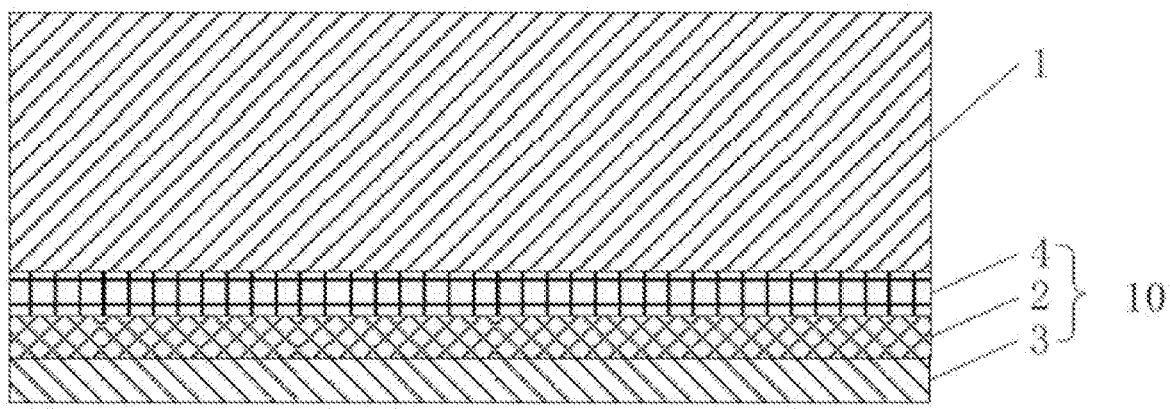
FIG. 1 is a schematic structural diagram illustrating an array substrate provided by a first embodiment of the present disclosure.

In following description, technical solutions in embodiments of the present disclosure will be clearly and completely described with reference to the drawings in the embodiments of the present disclosure. Obviously, the described embodiments are only a part of the embodiments of the present disclosure, but are not all of the embodiments. The other embodiments obtained by those skilled in the art, based on the embodiments of the present disclosure without creative work, fall into a protection scope of the present disclosure.

In the description of the present disclosure, it should be understood that, orientations or positional relationships indicated by the terms, such as "center", "longitudinal", "transverse", "length", "width", "thickness", "upper", "lower", "front", "rear", "left", "right", "vertical", "horizontal", "top", "bottom", "inside", "outside", "clockwise", and "counterclockwise", are based on the orientations or positional relationships shown in the drawings, and are only used for convenience of describing the present disclosure and simplifying the description. It does not indicate or imply that devices or elements to be referred must have a specific orientation or be constructed and operated in the specific orientation. Therefore, it cannot be understood as a limitation to the present disclosure.

In addition, terms "first" and "second" are only used for descriptive purposes, and cannot be understood as indicating or implying the relative importance or implicitly indicating a number of technical features which are indicated, thereby that features limiting "first", "second" may expressly or implicitly include one or more of said features. In the description of the present disclosure, a meaning of "multiple" is two or more, unless it is specifically defined otherwise.

As shown in FIG. 1, which is a schematic structural diagram illustrating an array substrate provided by a first embodiment of the present disclosure, in which the array substrate includes a wiring layer 1 and a non-wiring layer 10.

Figure 4:
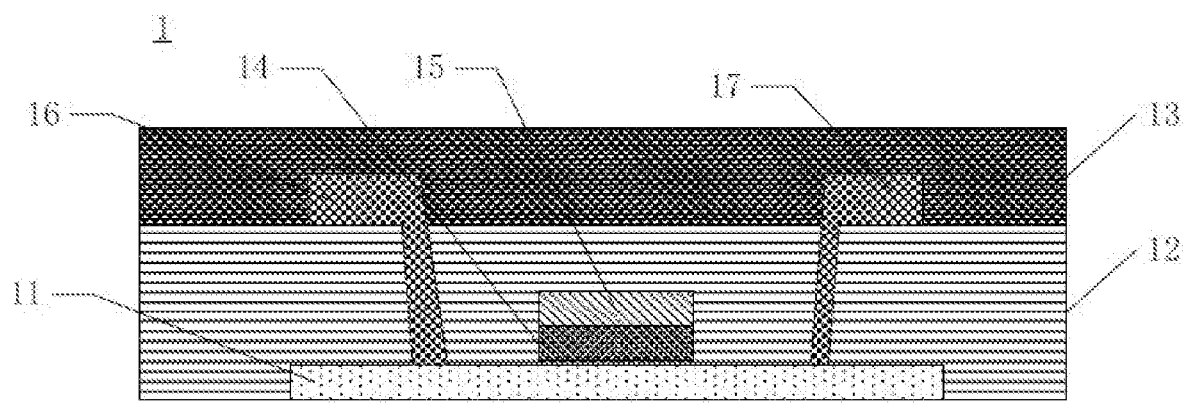
FIG. 4 is a schematic structural diagram illustrating a wiring layer provided by an embodiment of the present disclosure.

As shown in FIG. 4, in which the wiring layer 1 includes metal film layers (such as a gate layer 15). The metal film layers interfere and diffract light, and therefore interfere with imaging by a camera below a display panel.

The wiring layer 1 mainly includes an active layer 11, a source electrode layer 16, a drain electrode layer 17, the gate 15, a gate insulation layer 14, an interlayer dielectric layer 12, and a passivation layer 13.

The active layer 11 is disposed on the non-wiring layer 10. A material of the active layer 11 is an oxide, wherein a material of the oxide may be indium gallium zinc oxide (IGZO), indium zinc tin oxide (IZTO), indium gallium zinc tin oxide (IGZTO), and the like. A thickness of which ranges from 100 to 1000 Angstroms. In a process of manufacturing the oxide, photolithography performed on the oxide is required, in order to form the active layer 11.

One layer, such as the gate insulation layer 14, is provided on the active layer 11. In addition, one layer, such as the gate layer 15, is provided on the gate insulation layer 14.

A material of the gate insulation layer 14 is SiOx, SiNx, or a multi-layered structural film composed of SiOx and SiOx. A thickness of which ranges from 1000 to 3000 angstroms. In addition, a material of the gate layer 7 may be Mo, Al, Cu, Ti, or alloy. A thickness of which ranges from 2000 to 10000 Angstroms.

The active layer 11 and the non-wiring layer 10 are covered by one layer, such as the interlayer dielectric layer (IDL) 12. A material of the interlayer dielectric layer 12 is SiOx, SiNx, or a multi-layered structural film composed of SiOx and SiOx. A thickness of which ranges from 2000 to 10000 angstroms.

The source electrode layer 16 and the drain electrode layer 17 are disposed on the interlayer dielectric layer 12. In addition, the source electrode layer 16 and the drain electrode layer 17 may be made of copper.

In the first embodiment of the present disclosure, the non-wiring 10 includes a first film layer 2, a second film layer 3, and a third film layer 4. The first film layer 2 is disposed on a bottom portion of the wiring layer 1. The second film layer 3 is disposed adjacent to the first film layer 2 and is located on a bottom portion of the first film layer 2. The third film layer 4 is disposed adjacent to the second film layer 3 and is located on a bottom portion of the second film layer 3.

The non-wiring layer 10 is composed of inorganic layers. Each of the inorganic layers may be a glass substrate, but is not limited thereto. For example, it may be a plastic substrate or a base substrate made of a Polyimide (PI) material. In addition, the non-wiring layer 10 does not include metal film layers.

A refractive index of the second film layer 3 is smaller than a refractive index of the first film layer 2. In such a design, light can be transmitted from an optically dense medium region (such as the first film layer) to an optically sparse medium region (such as the second film layer), in which a refraction angle will be greater than an incident angle, such that the light with a larger incident angle will be totally reflected.

In this embodiment, a through hole 20 is further provided on the third film layer. A camera 5 is provided at a position corresponding to the through hole 20, and is located below the non-wiring layer 10. The through hole is configured to enhance light transmittance of the non-wiring layer 10, so that the camera 5 has a better shooting effect.

Advantages of the first embodiment of the present disclosure are that, by providing a combined structure (such as the first film layer and the second film layer), the light producing interference and diffraction is emitted from an optically dense medium region (such as the first film layer) to an optically sparse medium region (such as the second film layer), resulting in that the light with a larger incident angle is totally reflected. Thus, it can reduce the light producing interference and diffraction to enter the camera, to make the imaging of the camera below the screen free from the light producing interference and diffraction. In addition, by providing the through hole, light transmittance of the display panel is increased to make the camera shoot better.

Figure 2:
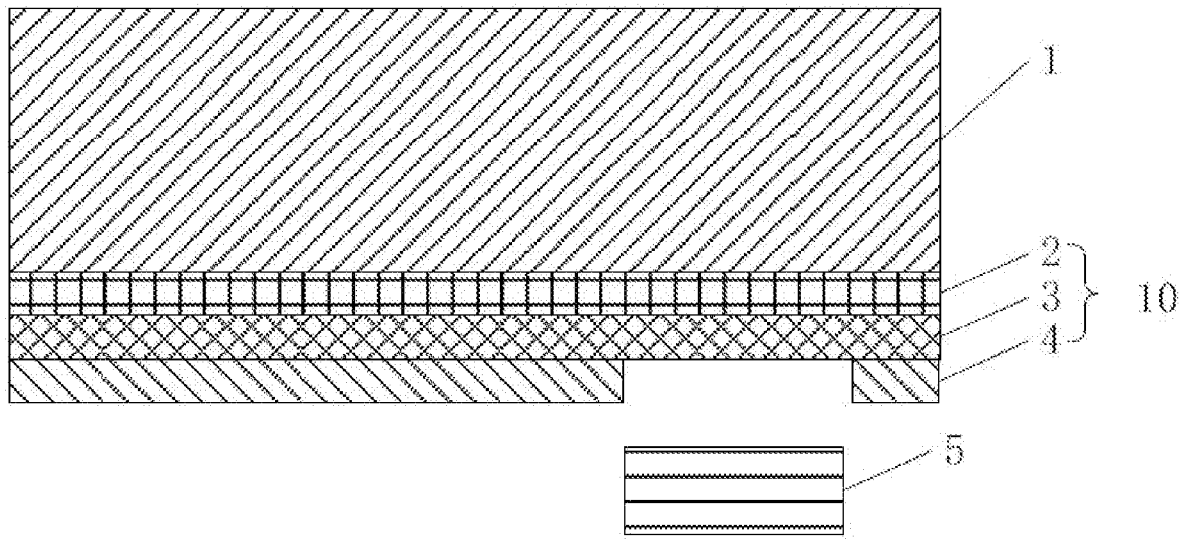
FIG. 2 is a schematic structural diagram illustrating an array substrate provided by a second embodiment of the present disclosure.

As shown in FIG. 2, which is a schematic structural diagram illustrating an array substrate provided by a second embodiment of the present disclosure, in which the array substrate includes a wiring layer 1 and a non-wiring layer 10.

In the second embodiment of the present disclosure, the non-wiring 10 includes a first film layer 2, a second film layer 3, and a third film layer 4. The third film layer 4 is disposed on a bottom portion of the wiring layer 1. The first film layer 2 is disposed adjacent to the third film layer 4 and is located on a bottom portion of the third film layer 4. The second film layer 3 is disposed adjacent to the first film layer 2 and is located on a bottom portion of the first film layer 2.

As shown in FIG. 4, the wiring layer 1 includes metal film layers (such as the gate layer 15). The metal film layers interfere and diffract light, and therefore interfere with imaging by a camera below a display panel.

The wiring layer 1 mainly includes an active layer 11, a source electrode layer 16, a drain electrode layer 17, a gate 15, the gate insulation layer 14, a interlayer dielectric layer 12, and a passivation layer 13.

The active layer 11 is disposed on the non-wiring layer 10. The material of the active layer 11 is an oxide, wherein the material of the oxide may be indium gallium zinc oxide (IGZO), indium zinc tin oxide (IZTO), indium gallium zinc tin oxide (IGZTO), and the like. The thickness of which ranges from 100 to 1000 Angstroms. In a process of manufacturing the oxide, photolithography performed on the oxide is required, in order to form the active layer 11.

One layer, such as the gate insulation layer 14, is provided on the active layer 11. In addition, one layer, such as the gate layer 15, is provided on the gate insulation layer 14.

The material of the gate insulation layer 14 is SiOx, SiNx, or the multi-layered structural film composed of SiOx and SiOx. The thickness of which ranges from 1000 to 3000 angstroms. In addition, the material of the gate layer 7 may be Mo, Al, Cu, Ti, or alloy. A thickness of which ranges from 2000 to 10000 Angstroms.

The active layer 11 and the non-wiring layer 10 are covered by one layer, such as the interlayer dielectric layer (IDL) 12. The material of the interlayer dielectric layer 12 is SiOx, SiNx, or a multi-layered structural film composed of SiOx and SiOx. The thickness of which ranges from 2000 to 10000 angstroms.

The source electrode layer 16 and the drain electrode layer 17 are disposed on the interlayer dielectric layer 12. In addition, the source electrode layer 16 and the drain electrode layer 17 may be made of copper.

In the first embodiment of the present disclosure, the non-wiring 10 includes the first film layer 2, the second film layer 3, and the third film layer 4.

The non-wiring layer 10 is composed of inorganic layers. Each of the inorganic layers may be the glass substrate, but is not limited thereto. For example, it may be the plastic substrate or the base substrate made of the PI material. In addition, the non-wiring layer 10 does not include metal film layers.

The refractive index of the second film layer 3 is smaller than the refractive index of the first film layer 2. In such a design, light can be transmitted from the optically dense medium region (such as the first film layer) to the optically sparse medium region (such as the second film layer), in which a refraction angle will be greater than an incident angle, such that the light with a larger incident angle will be totally reflected.

Advantages of the second embodiment of the present disclosure are that, by providing a combined structure (such as the first film layer and the second film layer), the light producing interference and diffraction is emitted from the optically dense medium region (such as the first film layer) to the optically sparse medium region (such as the second film layer), resulting in that the light with the larger incident angle is totally reflected. Even if the light with a smaller incident angle cannot be totally reflected, when the light with the smaller incident angle passes through this combined structure, a refraction angle will be increased. Thus, it can reduce the light producing interference and diffraction to enter the camera, to make the imaging of the camera below the screen free from the light producing interference and diffraction.

Figure 3:
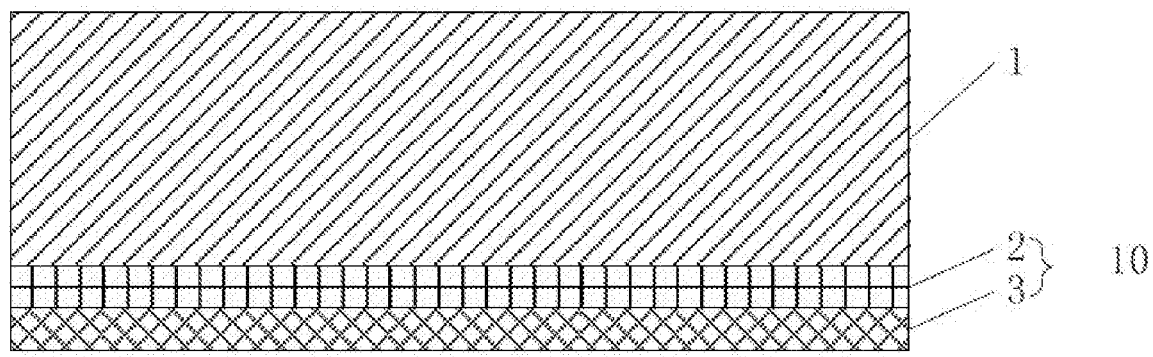
FIG. 3 is a schematic structural diagram illustrating an array substrate provided by a third embodiment of the present disclosure.

As shown in FIG. 3, which is a schematic structural diagram illustrating an array substrate provided by a third embodiment of the present disclosure.

In the third embodiment, the non-wiring 10 only includes a first film layer 2 and a second film layer 3. The first film layer 2 is disposed on a bottom portion of the wiring layer 1. The second film layer 3 is disposed adjacent to the first film layer 2 and is located on a bottom portion of the first film layer 2. In the third embodiment, except for different features described here, the other features are the same as those of the second embodiment, and no more description here.

Advantages of the third embodiment of the present disclosure are that, by providing a combined structure (such as the first film layer and the second film layer), the light producing interference and diffraction is emitted from the optically dense medium region (such as the first film layer) to the optically sparse medium region (such as the second film layer), resulting in that the light with the larger incident angle is totally reflected. In addition, even if the light with a smaller incident angle cannot be totally reflected, when the light with the smaller incident angle passes through this combined structure, a refraction angle will be increased. Thus, it can reduce the light producing interference and diffraction to enter the camera, to make the imaging of the camera below the screen free from the light producing interference and diffraction.

Furthermore, in addition to the cases described in the above embodiments, the non-wiring layer 10 of the present disclosure may include multiple cases. For example, the non-wiring layer 10 may further include the first film layer 2, the second film layer 3, the third film layer 4, and a fourth film layer, but is not limited thereto.

Figure 5:
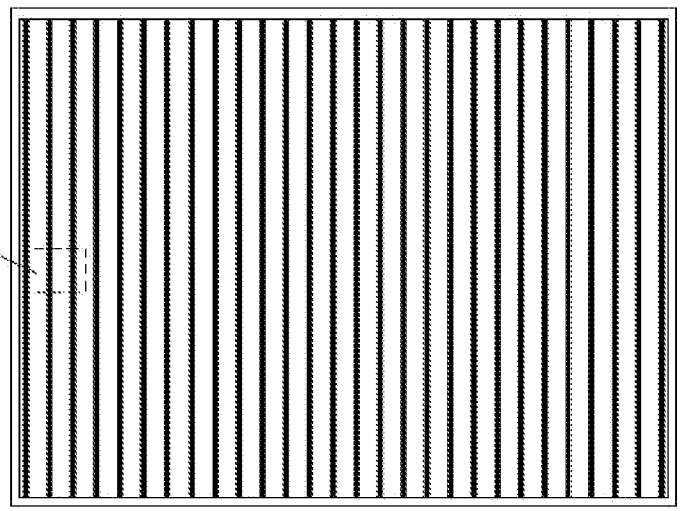
FIG. 5 is a schematic structural diagram illustrating a display panel provided by an embodiment of the present disclosure.

As shown in FIG. 5, one embodiment of the present disclosure further provides a display panel 50, which includes the array substrate 40 (within an area marked by dotted lines) described in the above embodiments, and an area outside the dotted lines is also represented as the array substrate. A specific structure of the array substrate 40 is as described above, and is not repeated here.

Figure 6:
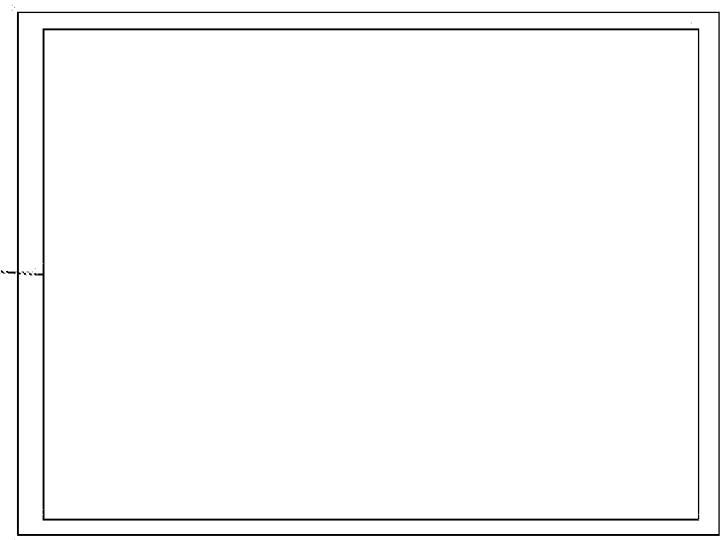
FIG. 6 is a schematic structural diagram illustrating a display device provided by an embodiment of the present disclosure.

In addition, as shown in FIG. 6, an embodiment of the present disclosure further provides a display device 60, which includes the display panel 50 in the above embodiments. The display device 60 may be any product or part with display capability, such as a liquid crystal television (TV), a liquid crystal display device (such as a flexible display or an efficient display), a mobile phone, and a digital photo frame, and a tablet.

In summary, although the present disclosure has been disclosed in the above preferred embodiments, the above preferred embodiments are not intended to limit the present disclosure. In addition, various modifications and changes may be made by those skilled in the art without departing from the spirit and scope of the present disclosure. Therefore, a scope of protection of the present disclosure is subject to a scope defined by the claims.

What is claimed is:

1. An array substrate, comprising:
a wiring layer; and
a non-wiring layer located on a bottom portion of the wiring layer;
wherein the non-wiring layer comprises a first film layer, a second film layer, and a third film layer, the first film layer and the second film layer are sequentially stacked in a direction away from the wiring layer, a refractive index of the second film layer is smaller than a refractive index of the first film layer, the first film layer is disposed on a top portion of the non-wiring layer, the second film layer is disposed adjacent to the first film layer and is located on a bottom portion of the first film layer, and the third film layer is disposed adjacent to the second film layer and is located on a bottom portion of the second film layer; and wherein a through hole is provided at a layer being the lowest within the non-wiring layer and the through hole is configured to enhance light transmittance of the non-wiring layer.

2. The array substrate as claimed in claim 1, wherein the first film layer is disposed at the bottom portion of the wiring layer, and the second film layer is disposed adjacent to the first film layer and is located on a bottom portion of the first film layer.

3. The array substrate as claimed in claim 1, wherein the non-wiring layer further comprises a third film layer, the third film layer is disposed on a top portion of the non-wiring layer, the first film layer is disposed adjacent to the third film layer and is located on a bottom portion of the third film layer, and the second film layer is disposed adjacent to the first film layer and is located on a bottom portion of the first film layer.

4. The array substrate as claimed in claim 1, wherein a region where the through hole locates corresponds to a region where an external camera places.

5. The array substrate as claimed in claim 1, wherein a material of the second film layer is one of silicon oxide, silicon nitride, or indium tin oxide.

6. The array substrate as claimed in claim 1, wherein the refractive index of the second film layer ranges from 1.4 to 2.1.

7. A display panel, comprising the array substrate as claimed in claim 1.

* * * * *